(12) United States Patent
Rho et al.

(10) Patent No.: US 9,529,267 B2
(45) Date of Patent: Dec. 27, 2016

(54) METHOD FOR PROCESSING A SUBSTRATE AND APPARATUS FOR PERFORMING THE SAME

(71) Applicants: Eun-Su Rho, Chungcheongnam-do (KR); Jeong-Yong Bae, Chungcheongnam-do (KR)

(72) Inventors: Eun-Su Rho, Chungcheongnam-do (KR); Jeong-Yong Bae, Chungcheongnam-do (KR)

(73) Assignee: Semes Co., Ltd. (KR)

( * ) Notice: Subject to any disclaimer, the term of this patent is extended or adjusted under 35 U.S.C. 154(b) by 599 days.

(21) Appl. No.: 13/928,446

(22) Filed: Jun. 27, 2013

(65) Prior Publication Data

US 2013/0284212 A1 Oct. 31, 2013

Related U.S. Application Data

(62) Division of application No. 12/824,364, filed on Jun. 28, 2010, now abandoned.

(30) Foreign Application Priority Data

Jun. 30, 2009 (KR) .................. 10-2009-0058743

(51) Int. Cl.
*B08B 3/00* (2006.01)
*G03F 7/42* (2006.01)
*H01L 21/67* (2006.01)

(52) U.S. Cl.
CPC .............. *G03F 7/422* (2013.01); *G03F 7/423* (2013.01); *H01L 21/6708* (2013.01)

(58) Field of Classification Search
None
See application file for complete search history.

(56) References Cited

U.S. PATENT DOCUMENTS

2008/0035182 A1* 2/2008 Nakatsukasa ..... H01L 21/02052
134/88

FOREIGN PATENT DOCUMENTS

JP 2004349669 A * 12/2004
JP 2006186101 A * 7/2006

OTHER PUBLICATIONS

JPO machine translation of JP 2004349669 retrieved Oct. 18, 2012.*
JPO machine translation of JP 2006186101 retrieved Jan. 22, 2016.*

* cited by examiner

*Primary Examiner* — Eric Golightly
(74) *Attorney, Agent, or Firm* — Daly, Crowley, Mofford & Durkee, LLP

(57) ABSTRACT

A method for processing a substrate includes arranging the substrate on which a photoresist layer is formed and providing a treatment liquid for removing the photoresist layer on the substrate. The method also includes providing a mist including deionized water or hydrogen peroxide on the substrate to make contact with the treatment liquid so as to increase a temperature of the treatment liquid. Therefore, efficiency of removing the photoresist layer may be improved.

15 Claims, 4 Drawing Sheets

METHOD FOR PROCESSING A SUBSTRATE AND APPARATUS FOR PERFORMING THE SAME

CROSS-REFERENCE TO RELATED APPLICATIONS

The present application is a divisional application of U.S. patent application Ser. No. 12/824,364, filed on Jun. 28, 2010, entitled: METHOD FOR PROCESSING A SUBSTRATE AND APPARATUS FOR PERFORMING THE SAME, which claims priority under 35 U.S.C. §119 to Korean Patent Application No. 2009-58743, filed on Jun. 30, 2009 in the Korean Intellectual Property Office (KIPO), the contents of which are herein incorporated by reference in their entirety.

BACKGROUND OF THE INVENTION

1. Field of the Invention

Example embodiments of the present invention relate to a method for processing a substrate and an apparatus for performing the method. More particularly, embodiments of the present invention relate to a method for processing a substrate and an apparatus for performing the method to manufacture a semiconductor device.

2. Description of the Related Art

In general, a substrate is sequentially treated through processes such as a photoresist coating, an exposing, a developing, an etching and a removing a photoresist in a semiconductor photolithographic process. The exposing, the developing and the etching are performed using the photoresist as a mask, and then the photoresist is removed.

Conventionally, the photoresist is removed using a solution having sulfuric acid and hydrogen peroxide mixed with each other. However, intermediates such as peroxymonosulfuric acid ($H_2SO_5$) and water are generated by a reaction between sulfuric acid and hydrogen peroxide, and thus a concentration of the solution is decreased. Thus, the photoresist may not be entirely removed by the solution. Therefore, technology for entirely removing the photoresist may be required.

SUMMARY OF THE INVENTION

Example embodiments of the present invention provide a method for processing a substrate capable of removing a photoresist on the substrate.

Example embodiments of the present invention also provide an apparatus for performing the above-mentioned method.

According to an example embodiment of the present invention, there is a provided a method for processing a substrate. In the method, the substrate on which a photoresist layer is formed is arranged. A treatment liquid for removing the photoresist layer is provided on the substrate. A mist including deionized water or hydrogen peroxide is provided on the substrate to make contact with the treatment liquid so as to increase a temperature of the treatment liquid.

In one embodiment, the mist may be formed by ultrasonic waves.

In one embodiment, a temperature of the mist may be between about 10° C. and about 99.9° C.

In one embodiment, a particle size of the mist may be between about 1 nm and about 100000 nm.

In one embodiment, the mist may be provided on the substrate using a carrier gas.

In one embodiment, the treatment liquid and the mist may be injected at the same time.

In one embodiment, the treatment liquid and the mist may make contact with each other before provided on the substrate.

In one embodiment, the treatment liquid and the mist may make contact with each other on the substrate.

In one embodiment, the substrate may spin, and the mist may be provided in front of a position of the substrate at which the treatment liquid is provided.

In one embodiment, the treatment liquid may include one of SPM (Sulfuric Acid/Peroxide), SOM (Sulfuric Acid/Ozone), SC-1 (NH4OH/Peroxide/Water), SC-2 (HCl/Peroxide/Water) and BOE (Buffered Oxide Etch: HF/NH4F).

According to another example embodiment of the present invention, an apparatus for processing a substrate includes a spin chuck, a first nozzle and a second nozzle. The spin chuck fixes and spins the substrate on which a photoresist layer is formed. The first nozzle is disposed over the spin chuck and provides a treatment liquid on the substrate so as to remove the photoresist layer. The second nozzle is disposed over the spin chuck and provides a mist including deionized water or hydrogen peroxide on the substrate to make contact with the treatment liquid so as to increase a temperature of the treatment liquid.

In one embodiment, a number of the second nozzle may be plural, and the second nozzles may be disposed around the first nozzle.

In one embodiment, the second nozzle may be disposed at a side of the first nozzle.

In one embodiment, the apparatus may further include a mist generation part connected with the second nozzle and generating the mist using a ultrasonic vibration so as to provide the mist to the second nozzle.

In one embodiment, the apparatus may further include a carrier gas providing part connected with the mist generation part and providing a carrier gas carrying the mist to the second nozzle.

In one embodiment, a temperature of the mist may be between about 10° C. and about 99.9° C.

In one embodiment, a particle size of the mist may be between about 1 nm and about 100000 nm.

In one embodiment, the treatment liquid may be one of SPM, SOM, SC-1, SC-2 and BOE.

According to the present invention, the treatment liquid for removing the photoresist layer and the mist including the deionized water or the hydrogen peroxide are provided on the substrate. The mist and the treatment liquid are reacted with each other to generate a radical hydroxide additionally. In addition, the mist and the treatment liquid are exothermically reacted, and thus a temperature of the treatment liquid may be increased. Therefore, efficiency of removing the photoresist layer may be improved.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION OF THE INVENTION

Figure 1:
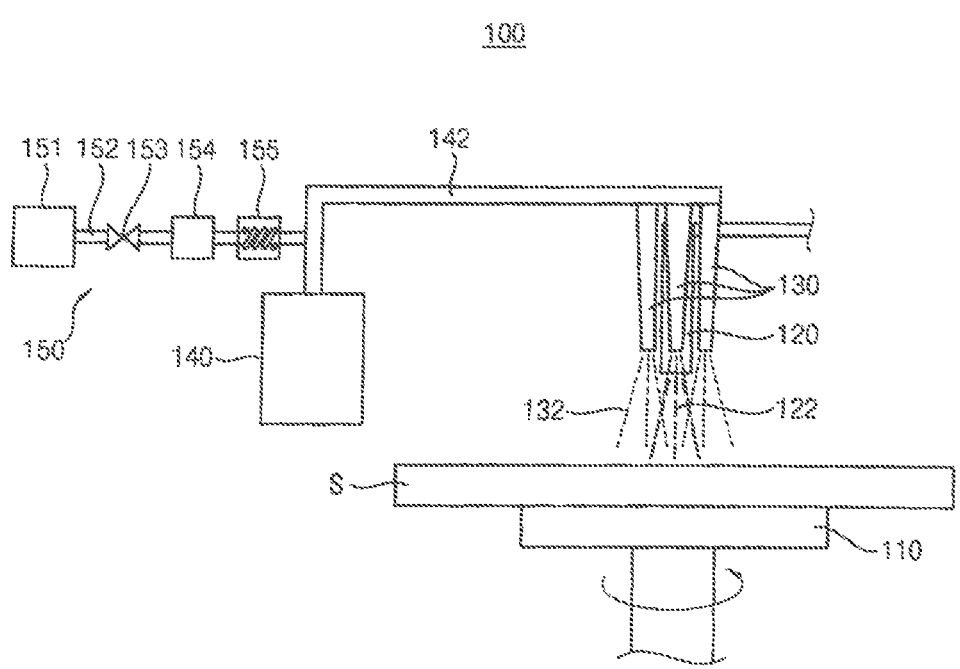
FIG. 1 is a schematic diagram illustrating an apparatus for processing a substrate according to an example embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, dements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated, in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a schematic diagram illustrating an apparatus for processing a substrate according to an example embodiment of the present invention.

Referring to FIG. 1, the apparatus 100 removes a photoresist layer on a substrate S, and the apparatus 100 includes a spin chuck 110, a first nozzle 120, a second nozzle 130, a mist generation part 140 and a carrier gas providing part 150.

The spin chuck 110 fixes and spins the substrate S. For example, the spin chuck 110 may include a mechanical chuck fixing the substrate S with a mechanical force, an electrostatic chuck fixing the substrate S with an electrostatic force, a vacuum chuck fixing the substrate S with a vacuum force, and so on.

The first nozzle 120 is disposed over the spin chuck 110 and provides a treatment liquid 122 to the substrate S. For example, the treatment liquid 122 may include one of SPM (Sulfuric acid Peroxide Mixture: Sulfuric Acid/Peroxide), SOM (Sulfuric Acid Ozone Mixture: Sulfuric Acid/Ozone), SC-1 (Standard Clean-1: NH4OH/Peroxide/Water), SC-2 (Standard Clean-2: HCl/Peroxide/Water), BOE (Buffered Oxide Etch: HF/NH4F), etc.

The treatment liquid 122 forms radical hydroxide and radical hydroxide reacts with the photoresist layer, so that the photoresist layer is removed. A temperature of the treatment liquid 122 may be high so that a reactivity of the photoresist layer is improved. For example, the temperature of the treatment liquid 122 may be between about 150° C. and about 240° C.

For example, each of the solutions forming the treatment liquid 122 may be combined with each other, and then may be provided on the substrate S. When each of the solutions forming the treatment liquid 122 is combined with each other before provided on the substrate S, the treatment liquid 122 may be continuously heated to be maintained between about 150° C. and about 240° C.

Alternatively, each of the solutions forming the treatment liquid 122 may be provided through lines different from each other, and the solutions may be combined right before the solutions are provided on the substrate S. When the solutions forming the treatment liquid 122 are combined with each other right before the solutions are provided on the substrate S, the temperature of the treatment liquid 122 may be increased to between about 150° C. and about 240° C. by the combination reaction.

A plurality of second nozzles 130 is disposed around the first nozzle 120 over the spin chuck 110. The second nozzle 130 provides a mist 132 on the substrate S. The mist 132 includes deionized water or hydrogen peroxide.

The first nozzle 120 and the second nozzles 130 may sequentially or simultaneously provide the treatment liquid 122 and the mist 132.

Figure 2:
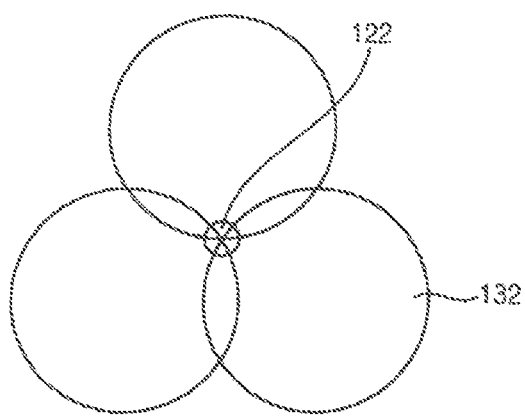
FIG. 2 and FIG. 3 are plan views illustrating injections of first and second nozzles in FIG. 1.
Figure 3:
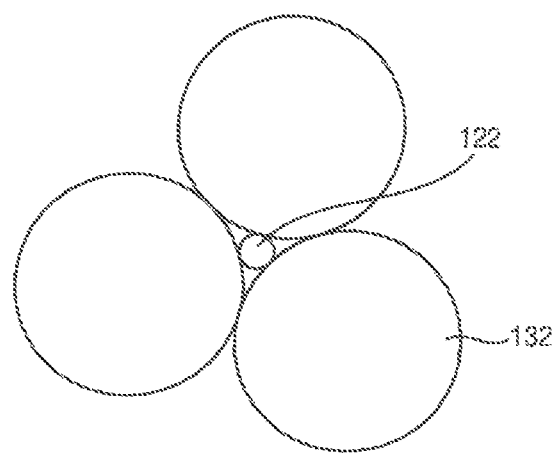

FIG. 2 and FIG. 3 are plan views illustrating injections of first nozzle and the second nozzles in FIG. 1.

Referring to FIG. 2, the treatment liquid 122 provided from the first nozzle 120 and the mist 132 provided from the second nozzle 130 may make contact with each other and be combined with each other before provided on the substrate S.

Referring to FIG. 3, the treatment liquid 122 and the mist 132 may make contact with each other and be combined with each other after provided on the substrate S. When the treatment liquid 122 and the mist 132 make contact with each other and are combined with each other after provided on the substrate S, the mist 132 may surround the treatment liquid 122 on the substrate S because the second nozzles 130 are disposed around the first nozzle 120.

Figure 4:
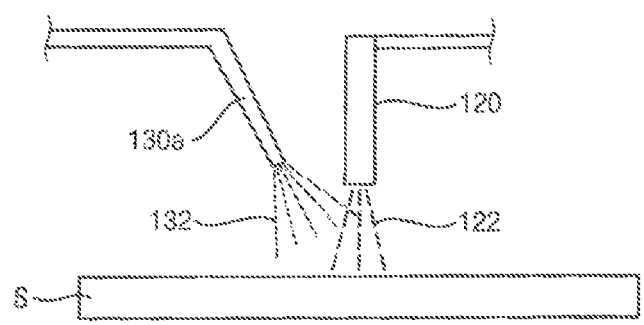
FIG. 4 is a schematic diagram illustrating another example second nozzle.

FIG. 4 is a schematic diagram illustrating another example second nozzle.

Referring to FIG. 4, a second nozzle 130a is disposed at a side of the first nozzle 120 over the spin chuck 110. The second nozzle 130a provides the mist 132 on the substrate S.

Figure 5:
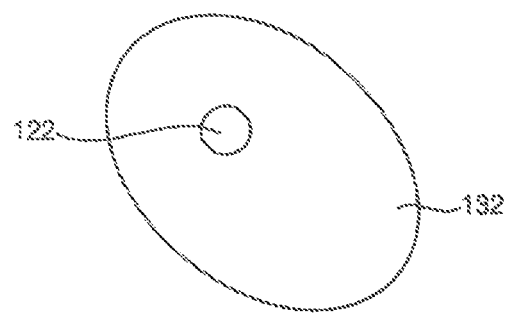
FIG. 5 and FIG. 6 are plan views illustrating injections of first and second nozzles in FIG. 4.
Figure 6:
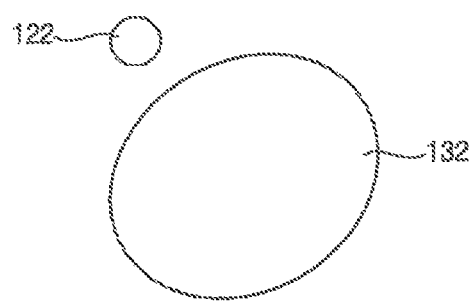

FIG. 5 and FIG. 6 are plan views illustrating injections of first nozzle and the second nozzles in FIG. 4.

Referring to FIG. 5, the treatment liquid 122 provided from the first nozzle 120 and the mist 132 provided from the second nozzle 130 may make contact with each other and be combined with each other before provided on the substrate S.

Referring to FIG. 6, the treatment liquid 122 and the mist 132 may make contact with each other and be combined with each other after provided on the substrate S. For example, the mist 132 may be provided in front of a position of the substrate S at which the treatment liquid 122 is provided according to a spin direction of the substrate S. Alternatively, the treatment liquid 122 may be provided in front of a position of the substrate S at which the mist 132 is provided according to the spin direction of the substrate S. Therefore, the mist 132 and the treatment liquid 122 may be spread, make contact each other, and then be combined with each other on the substrate S according to the spin of the substrate S.

When the treatment liquid 122 is SPM, sulfuric acid and hydrogen peroxide in SPM are forwardly reacted, and then peroxymonosulfuric acid ($H_2SO_5$) and water are generated. In this case, a temperature of SPM is high enough to easily evaporate the water. Therefore, the deionized water mist or the hydrogen peroxide mist provided to SPM is reacted with peroxymonosulfuric acid to generate radical hydroxide additionally, and thus the photoresist layer may be efficiently removed. In addition, the deionized water mist or the hydrogen peroxide mist and peroxymonosulfuric acid are exothermically reacted, and thus the temperature of SPM is increased. Thus, reactivity between SPM and the photoresist layer may be improved. Therefore, efficiency of SPM removing the photoresist layer may be improved.

When the mist 132 makes contact with one of SOM, SC-1, SC-2 and BOE, a reaction which is similar to the reaction occurring when the mist 132 makes contact with SPM occurs, and thus efficiency of removing the photoresist layer may be improved.

Referring to FIG. 1 again, the mist generation part 140 generates the mist 132. For example, the mist generation part 140 may include an ultrasonic vibrator. Ultrasonic waves of the ultrasonic vibrator may be between about several KHz and about several tens MHz.

The mist 132 having a particle size less than about 1 nm hardly exists. When the particle size of the mist 132 is greater than about 100000 nm, the mist 132 absorbs heat of the treatment liquid 122, and thus efficiency of removing the photoresist layer may be decreased. Therefore, the particle size of the mist 132 may be between about 1 nm and about 100000 nm.

In the ultrasonic vibrator generating the ultrasonic waves having about several tens MHz, the mist 132 having the particle size of about 1 nm may be generated. In the ultrasonic vibrator generating the ultrasonic waves having about several KHz, the mist 132 having the particle size of about 100000 nm may be generated.

The mist 132 is generated by the ultrasonic waves, and thus a temperature of the mist 132 may be less than about 100° C. When the temperature of the mist 132 is less than about 10° C., the mist 132 is hardly maintained. When the temperature of the mist 132 is greater than about 99.9° C., the mist 132 may be evaporated. Therefore, the temperature of the mist 132 may be between about 10° C. and about 99.9° C.

Vapor or steam is formed by a heating, but the mist 132 is formed by the ultrasonic waves. Therefore, the mist 132 may be formed easily compared to the vapor or the steam. In addition, the particle size of the mist 132 is greater than that of the vapor or the steam, and thus a flux of the mist 132 may be controlled easier than that of the vapor or the steam, and the mist 132 may be sufficiently provided to the substrate S.

A first providing line 142 connects the mist generation part 140 with the second nozzle 130. The mist 132 is provided to the second nozzle 130 through the first providing line 142.

The carrier gas providing part 150 provides a carrier gas to the mist 132 to carry the mist 132 generated from the mist generation part 140 to the second nozzle 130, and the carrier gas providing part 150 includes a tank 151, a second providing line 152, a valve 153, a flux controller 154 and a heater 155.

The tank 151 stores the carrier gas. The carrier gas may easily carry the mist 132 to the second nozzle 130. For example, the carrier gas may include a nitrogen gas.

The second providing line 152 connects the tank 151 with the first providing line 142. The carrier gas is provided to the first providing line 142 through the second providing line 152.

The valve 153 is disposed on the second providing line 152, and opens and closes the second providing line 152.

The flux controller 154 is disposed on the second providing line 152, and controls a flux of the carrier gas provided from the second providing line 152.

The flux controller 154 controls the flux of the carrier gas, and thus a flux of the mist 132 provided to the second nozzle 130 may be controlled.

The heater 155 is disposed on the second providing line 152, and controls a temperature of the carrier gas provided through the second providing line 152. When the temperature of the carrier gas is not less than about 100° C., the mist 132 may be evaporated by the carrier gas. Therefore, the carrier gas may be heated by the heater 155 between about 20° C. and about 99.9° C.

The apparatus 100 continuously provides the mist 132 to the treatment liquid 122. The radical hydroxide is additionally generated by the reaction between the mist 132 and the treatment liquid 122. The additionally generated radical hydroxide removes the photoresist layer, and thus the photoresist layer may be efficiently removed. The mist 132 and the treatment liquid 122 are exothermically reacted, and thus the temperature of the treatment liquid 122 is increased. Thus, reactivity between the treatment liquid 122 and the photoresist layer is improved. Therefore, the apparatus 100 may improve efficiency of removing the photoresist layer.

Figure 7:
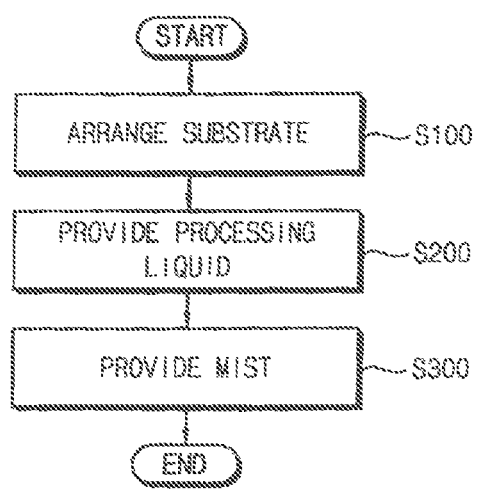
FIG. 7 is a flowchart for explaining a method for processing the substrate using the apparatus in FIG. 1.

FIG. 7 is a flowchart for explaining a method for processing the substrate using the apparatus in FIG. 1.

Referring to FIGS. 1 and 7, the substrate S for manufacturing a semiconductor device is arranged (step S100).

The substrate S has a photoresist layer formed on the substrate. The substrate S may be fixed and spun by a supporting member. For example, the supporting member may be the spin chuck 110. The spin chuck 110 may fix the substrate S using a mechanical power, an electrostatic force or a vacuum power.

The treatment liquid 122 is provided on the substrate S on which the photoresist layer is formed (step S200).

For example, the treatment liquid may include SPM, SOM, SC-1, SC-2, BOE, etc.

The temperature of the treatment liquid 122 is between about 150° C. and about 240° C. For example, each of the solutions forming the treatment liquid 122 may be combined with each other, and then the treatment liquid 122 may be provided on the substrate S. When each of the solutions forming the treatment liquid 122 is combined with each other before provided on the substrate S, the treatment liquid 122 may be continuously heated so that the temperature of the treatment liquid 122 is maintained between about 150° C. and about 240° C. Alternatively, each of the solutions forming the treatment liquid 122 may be combined with each other right before provided on the substrate S. When each of the solutions forming the treatment liquid 122 is combined with each other right before provided on the substrate S, the temperature of the treatment liquid 122 may be increased, between about 150° C. and about 240° C. due to the combination reaction.

The treatment liquid 122 removes the photoresist layer through a chemical reaction. For example, the treatment liquid 122 forms radical hydroxide, and the radical hydroxide is reacted with the photoresist layer, so that the photoresist layer is removed.

The mist 132 is provided on the substrate S (step S300).

The mist 132 includes deionized water or hydrogen peroxide. The mist 132 may be generated by ultrasonic waves. The ultrasonic waves may have a frequency of between about several KHz and several tens MHz.

The mist 132 having a particle size less than about 1 nm hardly exists. When the particle size of the mist 132 is greater than about 100000 nm, the mist 132 absorbs heat of the treatment liquid 122. Thus, efficiency of removing the photoresist layer may be decreased because the temperature of the treatment liquid 122 is decreased. Therefore, the particle size of the mist 132 may be between about 1 nm and about 100000 nm.

The mist 132 is generated by the ultrasonic waves, and thus a temperature of the mist 132 may be less than about 100° C. When the temperature of the mist 132 is less than about 10° C., the mist 132 is hardly maintained. When the temperature of the mist 132 is greater than about 99.9° C., the mist 132 may be evaporated by heat. Therefore, the temperature of the mist 132 may be between about 10° C. and about 99.9° C.

Vapor or steam is formed by a heating, but the mist 132 is formed by the ultrasonic waves. Therefore, the mist 132 may be formed easily compared to the vapor or the steam. In addition, the particle size of the mist 132 is greater than that of the vapor or the steam, and thus a flux of the mist 132 may be controlled easier than that of the vapor or the steam and the mist 132 may be sufficiently provided to the substrate S.

The mist 132 may be provided on the substrate S using the carrier gas. For example, the carrier gas may include a nitrogen gas. The flux of the mist 132 may be controlled by controlling a flux of a carrier gas. The carrier gas may be provided with a steady temperature by heating. When the temperature of the carrier gas is not less than about 100° C., the mist 132 may be evaporated by the carrier gas. Thus, the temperature of the carrier gas may be maintained between about 20° C. and about 99.9° C.

For example, the treatment liquid 122 and the mist 132 are sequentially provided on the substrate S. Alternatively, the treatment liquid 122 and the mist 132 are provided on the substrate S at the same time.

For example, the treatment liquid 122 and the mist 132 may make contact with each other and be combined with each other before provided on the substrate S. Alternatively, the treatment liquid 122 and the mist 132 may make contact with each other and be combined with each other after provided on the substrate S.

For example, the mist 132 may be provided in front of a position of the substrate S at which the treatment liquid 122 is provided according to a spin direction of the substrate S. Alternatively, the treatment liquid 122 may be provided in front of a position of the substrate S at which the mist 132 is provided according to the spin direction of the substrate S.

Thus, the mist 132 may continuously make contact with the treatment liquid 122.

When the treatment liquid 122 is SPM, sulfuric acid and hydrogen peroxide in SPM is forwardly reacted, and then peroxymonosulfuric acid (H2SO5) and water are generated. A temperature of SPM is high enough to evaporate the water, and thus the water is easily evaporated. Therefore, the deionized water mist or the hydrogen peroxide mist provided to SPM is reacted with peroxymonosulfuric acid to generate radical hydroxide additionally, and thus the photoresist layer may be efficiently removed. In addition, the deionized water mist or the hydrogen peroxide mist and peroxymonosulfuric acid are exothermically reacted, and thus the temperature of SPM is increased.

When the mist 132 makes contact with one of SOM, SC-1, SC-2 and BOE, a reaction which is similar to the reaction occurring when the mist 132 makes contact with SPM occurs, and thus efficiency of removing the photoresist layer may be improved.

As described above, the mist 132 and the treatment liquid 122 are chemically reacted with each other to additionally generate radical hydroxide. The additionally generated radical hydroxide removes the photoresist layer, and thus the photoresist layer may be efficiently removed. The mist 132 and the treatment liquid 122 are exothermically reacted, and thus the temperature of the treatment liquid 122 is increased. Thus, reactivity between the treatment liquid 122 and the photoresist layer is improved.

According to the present invention, the treatment liquid for removing the photoresist layer and the mist including the deionized water and the hydrogen peroxide are provided on the substrate. The mist and the treatment liquid are reacted with each other to generate the radical hydroxide additionally. The additionally generated radical hydroxide removes the photoresist layer, and thus the photoresist layer may be efficiently removed. In addition, the mist and the treatment liquid are exothermically reacted, and thus the temperature of the treatment liquid may be increased. Therefore, efficiency of removing the photoresist layer may be improved.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A method for processing a substrate, the method comprising:

arranging the substrate on which a photoresist layer is formed;

providing a treatment liquid for removing the photoresist layer on the substrate; and providing a mist including deionized water or hydrogen peroxide on the substrate to make contact with the treatment liquid such that the mist and the treatment liquid react with each other so as to increase a temperature of the treatment liquid, and to generate a radical hydroxide which reacts with the photoresist layer to substantially remove the photoresist layer from the substrate, wherein the treatment liquid and the mist make contact with each other before provided on the substrate.

2. The method of claim 1, wherein the mist is formed by ultrasonic waves.

3. The method of claim 1, wherein a temperature of the mist is between about 10° C. and about 99.9° C.

4. The method of claim 1, wherein a particle size of the mist is between about 1 nm and about 100000 nm.

5. The method of claim 1, wherein the mist is provided on the substrate using a carrier gas.

6. The method of claim 1, wherein the treatment liquid and the mist are injected at the same time.

7. The method of claim 1, wherein the substrate spins, and the mist is provided in front of a position of the substrate at which the treatment liquid is provided.

8. The method of claim 1, wherein the treatment liquid includes one of SOM (Sulfuric Acid/Ozone), SC-1 (NH4OH/Peroxide/Water), SC-2 (HCl/Peroxide/Water) and BOE (Buffered Oxide Etch: HF/NH4F).

9. The method of claim 1, wherein the mist and the treatment liquid exothermically react with each other.

10. The method of claim 2, wherein the ultrasonic waves have a frequency of several kHz.

11. The method of claim 5, wherein a temperature of the carrier gas is substantially maintained between about 20° C. and about 99.9° C.

12. The method of claim 5, wherein a flow of the mist provided on the substrate is controlled by controlling a flow of the carrier gas.

13. The method of claim 1, wherein a temperature of the mist is about 10° C.

14. The method of claim 1, wherein a temperature of the mist is about 99.9° C.

15. The method of claim 1, wherein the mist does not include hydrogen peroxide.

* * * * *